United States Patent
Kakiuchi

(10) Patent No.: US 11,273,641 B2
(45) Date of Patent: Mar. 15, 2022

(54) PIEZOELECTRIC ACTUATOR AND LIQUID EJECTION APPARATUS

(71) Applicant: Brother Kogyo Kabushiki Kaisha, Nagoya (JP)

(72) Inventor: Toru Kakiuchi, Chita-gun (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 8 days.

(21) Appl. No.: 16/834,333

(22) Filed: Mar. 30, 2020

(65) Prior Publication Data

US 2020/0307217 A1    Oct. 1, 2020

(30) Foreign Application Priority Data

Apr. 1, 2019    (JP) .............................. JP2019-069633

(51) Int. Cl.
| | | |
|---|---|---|
| B41J 2/14 | (2006.01) | |
| B41J 2/16 | (2006.01) | |
| H01L 41/047 | (2006.01) | |
| H01L 41/18 | (2006.01) | |
| H01L 41/09 | (2006.01) | |

(52) U.S. Cl.
CPC .......... B41J 2/14233 (2013.01); B41J 2/161 (2013.01); H01L 41/047 (2013.01); H01L 41/09 (2013.01); H01L 41/18 (2013.01); *B41J 2002/14258* (2013.01); *B41J 2002/14491* (2013.01)

(58) Field of Classification Search
None
See application file for complete search history.

(56) References Cited

U.S. PATENT DOCUMENTS

| | | |
|---|---|---|
| 8,585,188 B2 | 11/2013 | Ohta |
| 2002/0080213 A1 | 6/2002 | Shimada et al. |
| 2009/0085984 A1* | 4/2009 | Kojima ................ B41J 2/14233 347/68 |
| 2010/0231659 A1 | 9/2010 | Ohta |
| 2011/0122205 A1 | 5/2011 | Hirai |
| 2013/0050353 A1 | 2/2013 | Ohta |
| 2015/0042728 A1 | 2/2015 | Hirai |
| 2017/0087825 A1 | 3/2017 | Kato et al. |

FOREIGN PATENT DOCUMENTS

| | | |
|---|---|---|
| JP | 2000-094688 A | 4/2000 |
| JP | 2000-208828 A | 7/2000 |
| JP | 2010-214634 A | 9/2010 |
| JP | 2010-241080 A | 10/2010 |
| JP | 2010-284960 A | 12/2010 |
| JP | 2011-110784 A | 6/2011 |
| JP | 2013-256137 A | 12/2013 |
| JP | 2013-256138 A | 12/2013 |
| JP | 2017-065094 A | 4/2017 |

* cited by examiner

*Primary Examiner* — Erica S Lin
(74) *Attorney, Agent, or Firm* — Banner & Witcoff, Ltd.

(57) ABSTRACT

A piezoelectric actuator includes a common electrode, an individual electrode, a first conductive pattern, a second conductive pattern, and a third conductive pattern. The first conductive pattern electrically connects to the common electrode. The second conductive pattern does not electrically connect to either the common electrode or the individual electrode. The third conductive pattern electrically connects to the individual electrode. The first conductive pattern and the third conductive pattern are opposite to each other relative to the second conductive pattern.

17 Claims, 9 Drawing Sheets

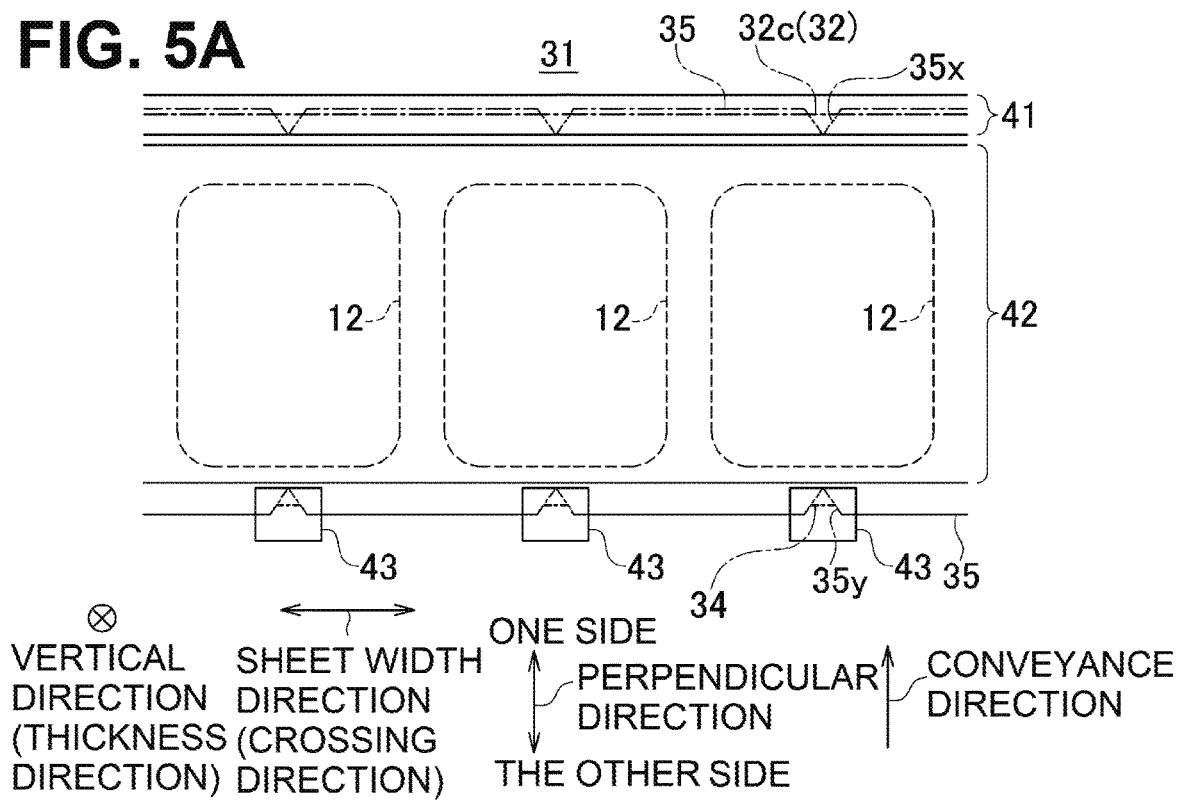
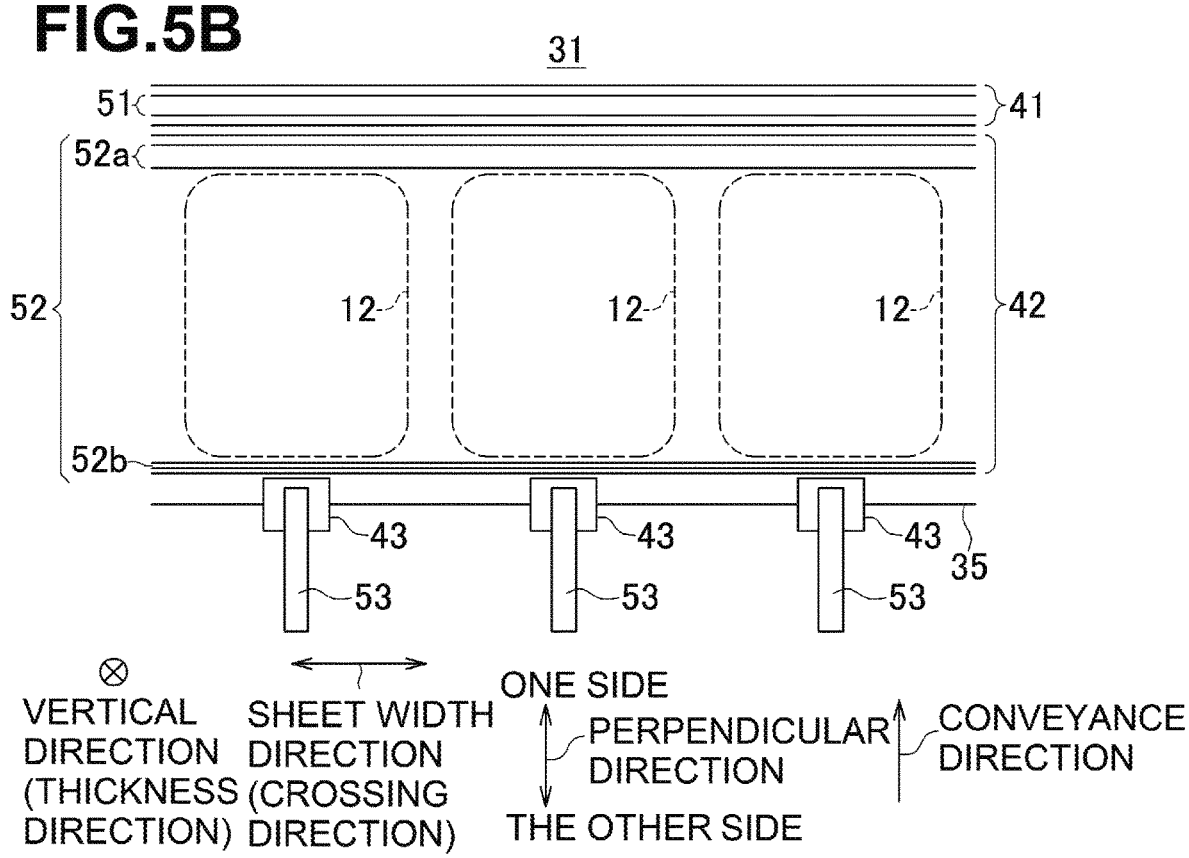

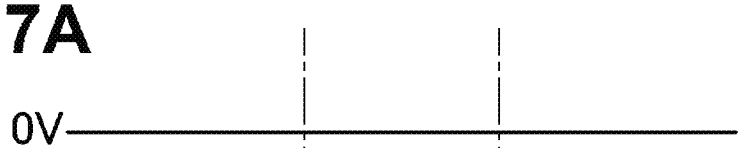
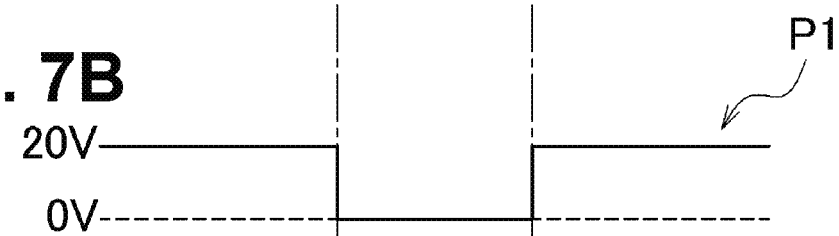
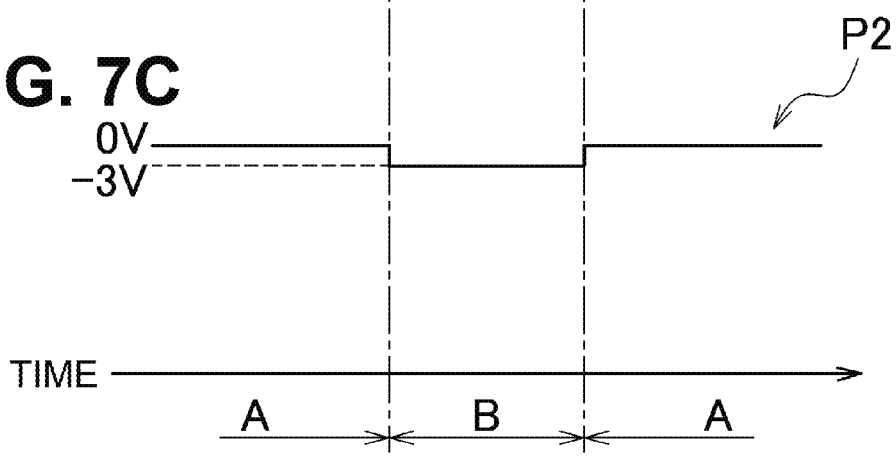

PIEZOELECTRIC ACTUATOR AND LIQUID EJECTION APPARATUS

CROSS-REFERENCE TO RELATED APPLICATION

This application claims priority from Japanese Patent Application No. 2019-069633 filed on Apr. 1, 2019, the content of which is incorporated herein by reference in its entirety.

TECHNICAL FIELD

Aspects of the disclosure relate to a piezoelectric actuator and a liquid ejection apparatus including the piezoelectric actuator.

BACKGROUND

A known piezoelectric actuator includes a lower electrode, a first piezoelectric layer disposed on the lower electrode, an intermediate electrode disposed on the first piezoelectric layer, a second piezoelectric layer disposed on the intermediate electrode, and an upper electrode disposed on the second piezoelectric layer. The lower electrode and the upper electrode electrically connect to each other by an electrode connector. An upper/lower electrode wire is led from the electrode connector. An intermediate electrode wire is lead from the intermediate electrode.

SUMMARY

The upper/lower electrode wire and the intermediate electrode wire are led on the same side of the piezoelectric actuator relative to the intermediate electrode. For electrical insulation between the upper/lower electrode wire and the intermediate electrode wire, an insulation layer is required between the upper/lower electrode wire and the intermediate electrode wire, which may lead to a complicated configuration of the piezoelectric actuator. Even if the insulation layer is provided, electrical reliability of the piezoelectric actuator may be reduced because a distance between the wires is short.

Aspects of the disclosure provide a piezoelectric actuator and a liquid ejection apparatus including the piezoelectric actuator that may achieve a simplified configuration and increase electrical reliability.

According to one aspect of the disclosure, a piezoelectric actuator comprise a common electrode, a first piezoelectric body disposed at one side of the common electrode in a thickness direction of the common electrode, an individual electrode disposed at one side of the first piezoelectric body in the thickness direction, a second piezoelectric body disposed at one side of the individual electrode in the thickness direction, a first conductive pattern disposed at one side of the second piezoelectric body in the thickness direction, a second conductive pattern disposed at the one side of the second piezoelectric body in the thickness direction, the second conductive pattern being insulated from the first conductive pattern, and a third conductive pattern disposed at the one side of the second piezoelectric body in the thickness direction. The third conductive pattern is insulated from the first conductive pattern and the second conductive pattern. The first conductive pattern electrically connects to the common electrode, and does not to electrically connect to the individual electrode. The second conductive pattern does not electrically connect to either the common electrode or the individual electrode. The third conductive pattern does not electrically connect to the common electrode, and electrically connects to the individual electrode. The first conductive pattern is disposed at one side of the second conductive pattern in a perpendicular direction that is perpendicular to the thickness direction. The third conductive pattern is disposed at an other side of the second conductive pattern in the perpendicular direction.

According to another aspect of the disclosure, a liquid ejection apparatus comprises a pressure chamber substrate having a pressure chamber formed therein, a diaphragm disposed at one side of the pressure chamber substrate in the thickness direction, the diaphragm covering the pressure chamber, a common electrode disposed at one side of the diaphragm in the thickness direction, a first piezoelectric body disposed at one side of the common electrode in the thickness direction, an individual electrode disposed at one side of the first piezoelectric body in the thickness direction, a second piezoelectric body disposed at one side of the individual electrode in the thickness direction, a first conductive pattern disposed at one side of the second piezoelectric body in the thickness direction, a second conductive pattern disposed at the one side of the second piezoelectric body in the thickness direction, the second conductive pattern being insulated from the first conductive pattern, and a third conductive pattern disposed at the one side of the second piezoelectric body in the thickness direction. The third conductive pattern is insulated from the first conductive pattern and the second conductive pattern. The first conductive pattern electrically connects to the common electrode, and does not electrically connect to the individual electrode. The second conductive pattern does not electrically connect to either the common electrode or the individual electrode. The second conductive pattern, the common electrode, and the individual electrode overlap, in the thickness direction, with the pressure chamber. The third conductive pattern does not electrically connect to the common electrode, and electrically connects to the individual electrode. The first conductive pattern is disposed at one side of the second conductive pattern in a perpendicular direction that is perpendicular to the thickness direction. The third conductive pattern is disposed at another side of the second conductive pattern in the perpendicular direction.

According to still another aspect of the disclosure, a piezoelectric actuator comprises a first actuator array and a second actuator array. The first actuator array includes a common electrode, a first piezoelectric body disposed at one side of the common electrode in a thickness direction of the common electrode, an individual electrode disposed at one side of the first piezoelectric body in the thickness direction, a second piezoelectric body disposed at one side of the individual electrode in the thickness direction, a first conductive pattern disposed at one side of the second piezoelectric body in the thickness direction, a second conductive pattern disposed at the one side of the second piezoelectric body in the thickness direction, the second conductive pattern being insulated from the first conductive pattern, and a third conductive pattern disposed at the one side of the second piezoelectric body in the thickness direction. The third conductive pattern is insulated from the first conductive pattern and the second conductive pattern. The second actuator array includes a common electrode, a first piezoelectric body disposed at one side of the common electrode in the thickness direction, an individual electrode disposed at one side of the first piezoelectric body in the thickness direction, a second piezoelectric body disposed at one side of the individual electrode in the thickness direction, a first conductive pattern disposed at one side of the first piezoelectric body of the second actuator array in the thickness direction, a second conductive pattern disposed at the one side of the first piezoelectric body of the second actuator array in the thickness direction, the second conductive pattern of the second actuator array being insulated from the first conductive pattern of the second actuator array, a third conductive pattern disposed at the one side of the fourth second piezoelectric body of the second actuator array in the thickness direction. The third conductive pattern of the second actuator array is insulated from the first conductive pattern of the second actuator array and the second conductive pattern of the second actuator array. The first conductive pattern of the first actuator array electrically connects to the common electrode of the first actuator array, and does not electrically connect to the individual electrode of the first actuator array. The second conductive pattern of the first actuator array does not electrically connect to either the common electrode or the individual electrode of the first actuator array. The third conductive pattern of the first actuator array does not electrically connect to the common electrode of the first actuator array, and electrically connects to the individual electrode of the first actuator array. The first conductive pattern of the second actuator array electrically connects to the common electrode of the second actuator array, and does not electrically connect to the individual electrode of the second actuator array. The second conductive pattern of the second actuator array does not electrically connect to either the common electrode or the individual electrode of the second actuator array. The third conductive pattern of the second actuator array does not electrically connect to the common electrode of the second actuator array, and electrically connects to the individual electrode of the second actuator array. The second conductive pattern of the first actuator array and the second conductive pattern of the second actuator array are disposed between the first conductive pattern of the first actuator array and the first conductive pattern of the second actuator array in a perpendicular direction that is perpendicular to the thickness direction. The third conductive pattern of the first actuator array and the third conductive pattern of the second actuator array are disposed between the second conductive pattern of the first actuator array and the second conductive pattern of the second actuator array in the perpendicular direction.

According to aspects of the disclosure, configuration of the piezoelectric actuator may be simplified and electrical reliability of the piezoelectric actuator may be increased.

BRIEF DESCRIPTION OF THE DRAWINGS

FIGS. 5A and 5B are plan views of the region IV of the head of FIG. 2 enclosed by a dot-and-dash line, illustrating manufacturing processes of the piezoelectric actuator.

FIG. 7A-7C are diagrams illustrating signals applied to conductive patterns of the piezoelectric actuator.

DETAILED DESCRIPTION

Figure 1:
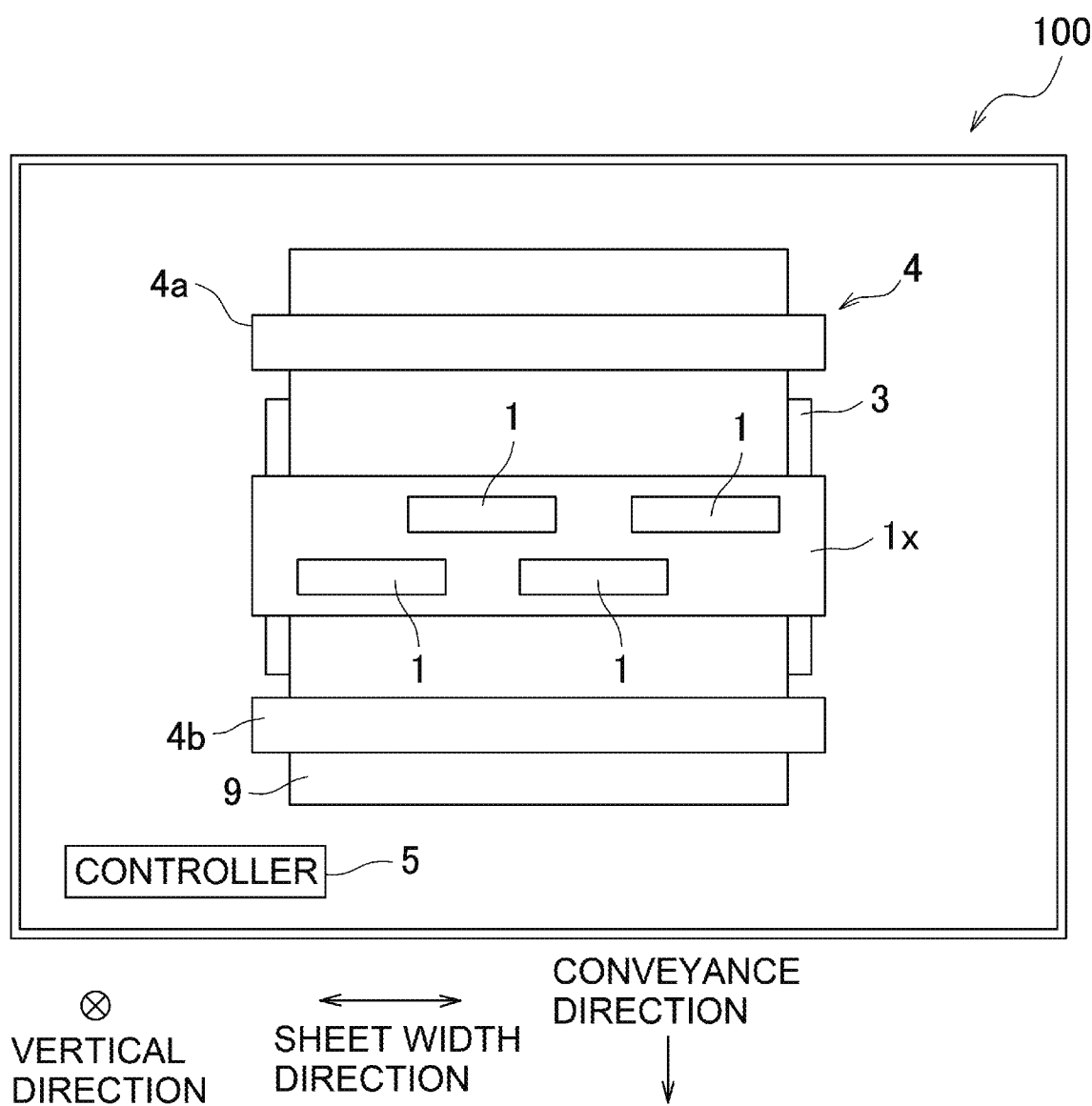
FIG. 1 is a plan view of a printer including a head that includes a piezoelectric actuator in an illustrative embodiment according to aspects of the disclosure.

Referring to FIG. 1, a configuration of a printer 100 in an illustrative embodiment will be described below.

The printer 100 includes a head unit 1x that includes four heads 1, a platen 3, a conveyance mechanism 4, and a controller 5.

The platen 3 has an upper surface configured to support a sheet 9.

Figure 6:
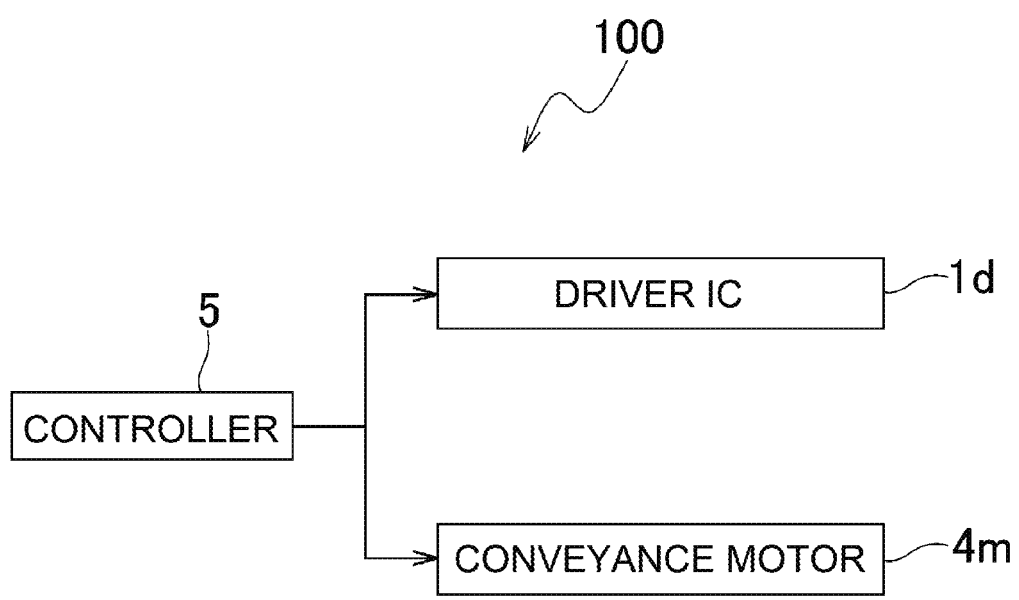
FIG. 6 is a block diagram illustrating an electrical configuration of the printer of FIG. 1.

The conveyance mechanism 4 has two roller pairs 4a and 4b disposed sandwiching the platen 3 in a conveyance direction. A conveyance motor 4m (refer to FIG. 6) is driven under the control of the controller 5. This may cause the roller pairs 4a and 4b to rotate while pinching the sheet 9, thereby conveying the sheet 9 in the conveyance direction.

The head unit 1x is longer in a sheet width direction, which is perpendicular to both of the conveyance direction and a vertical direction. The head unit 1x is of a line type, in which the head unit 1x at a fixed position ejects ink to the sheet 9 through nozzles 11 (refer to FIGS. 2 and 3). Each of the four heads 1 is longer in the sheet width direction. The four heads 1 are staggered in the sheet width direction.

The controller 5 includes a read only memory (ROM), a random access memory (RAM), and an application specific integrated circuit (ASIC). The ASIC performs processes, such as a recording process, in accordance with programs stored in the ROM. In the recording process, the controller 5 controls a driver IC 1d (in FIG. 6) in each head 1 and the conveyance motor 4m (in FIG. 6) in accordance with a recording command (including image data) input through an external device, such as a personal computer (PC), to record an image on the sheet 9.

Figure 2:
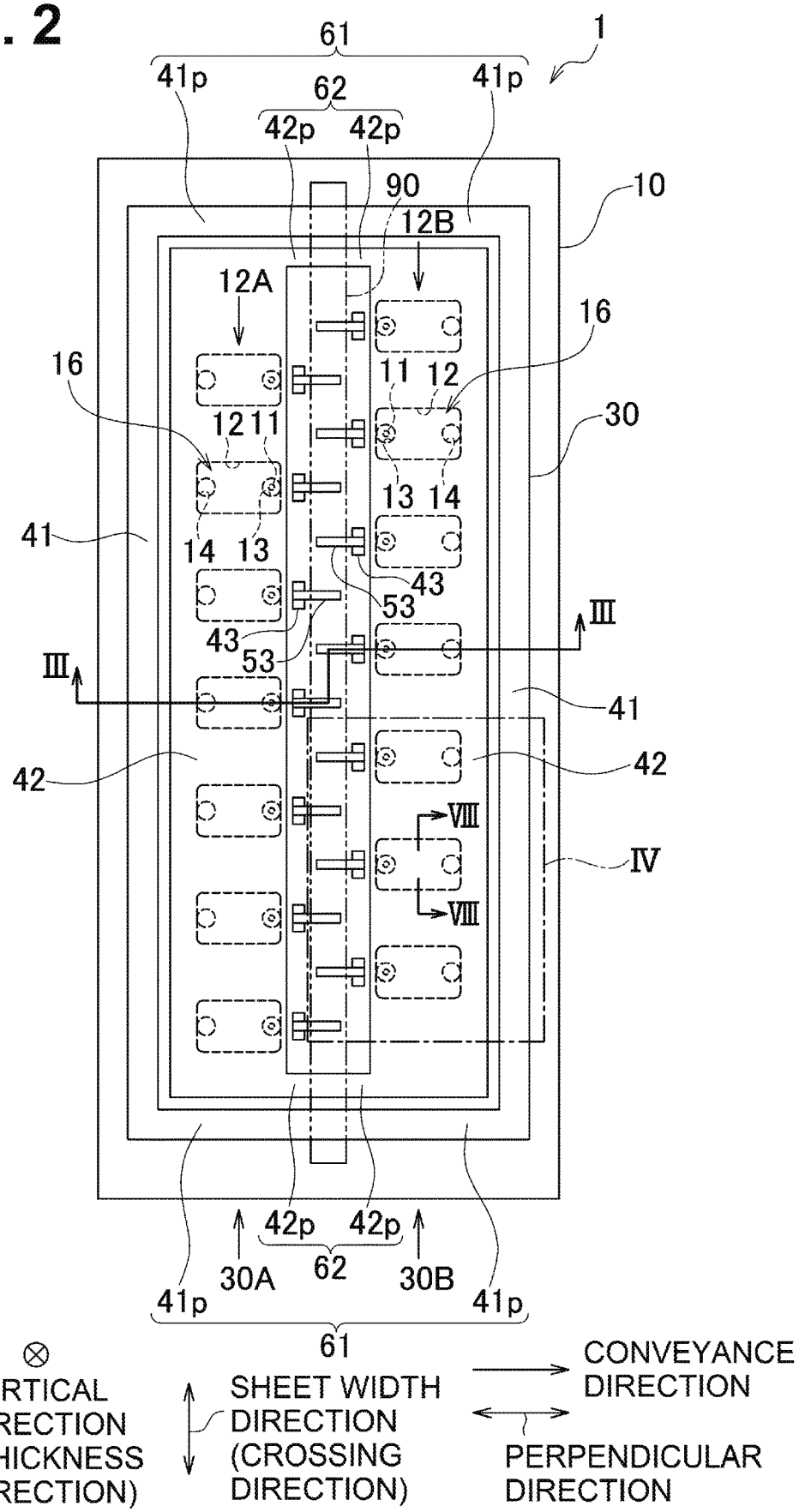
FIG. 2 is a plan view of the head of the printer in FIG. 1.
Figure 3:
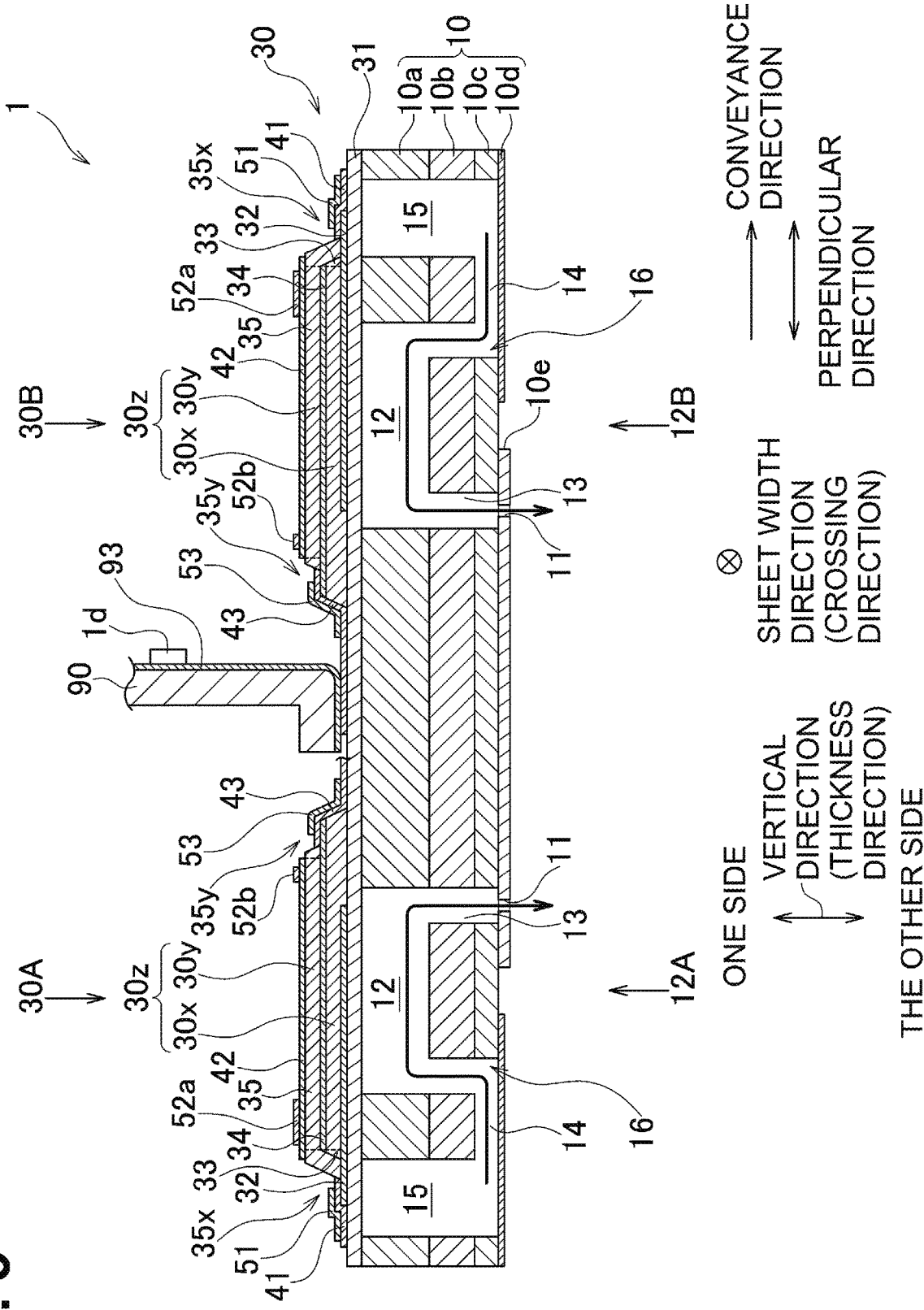
FIG. 3 is a cross-sectional view of the head, taken along a line III-III in FIG. 2.

Referring to FIGS. 2 and 3, a configuration of the head 1 will now be described.

The head 1 includes a channel substrate 10, a piezoelectric actuator 30, and a wiring substrate 90.

As depicted in FIG. 3, the channel substrate 10 includes three plates 10a-10c, which are bonded to together in the vertical direction (e.g., a thickness direction), two damper films 10d, and a plate 10e. The damper films 10d are bonded to a one-side end portion and another-side end portion of a lower surface of the plate 10c in a width direction of the channel substrate 10. The width direction of the channel substrate 10 corresponds to a direction parallel to the conveyance direction and may be referred to as a "perpendicular direction". The plate 10e is bonded to a central portion of the lower surface of the plate 10c in the perpendicular direction. The channel substrate 10 has two common channels 15 and a plurality of individual channels 16. The common channels 15 and the individual channels 16 may be defined by through-holes formed in the plates 10a-10c, and 10e.

Each of the two common channels 15 is provided at a respective end of the channel substrate 10 in the perpendicular direction. The common channel 15 extends in a longitudinal direction of the channel substrate 10. The longitudinal direction of the channel substrate 10 corresponds to the sheet width direction and may be referred to as a "crossing direction". FIG. 2 does not show the common channels 15.

As depicted in FIG. 3, each of the individual channels 16 includes a nozzle 11, a pressure chamber 12, a communication path 13 that brings the nozzle 11 and the pressure chamber 12 into communication with each other, and a communication path 14 that brings the pressure chamber 12 and the common channel 15 into communication with each other.

As depicted in FIG. 2, the pressure chambers 12 included in the respective individual channels 16 are staggered in the crossing direction. The pressure chambers 12 constitute a first pressure chamber array 12A and a second pressure chamber array 12B. The first pressure chamber array 12A and the second chamber array 12B are arranged in the perpendicular direction. Each of the first pressure chamber array 12A and the second chamber array 12B includes the pressure chambers 12 that are equi-distantly arranged in line in the crossing direction. As depicted in FIG. 2, each of the pressure chambers 12 has a generally rectangular shape elongated in the perpendicular direction in a plane perpendicular to the thickness direction.

The individual channel 16, which includes the pressure chamber 12 of the first pressure chamber array 12A, communicates with one of the common channels 15 (e.g., a left common channel 15 in FIG. 3). The individual channel 16, which includes the pressure chamber 12 of the second pressure chamber array 12B, communicates with the other one of the common channels 15 (e.g., a right common channel 15 in FIG. 3).

Each of the common channels 15 communicates with a sub-tank (not depicted). The sub-tank communicates with a main tank and stores ink from the main tank. Ink in the sub-tank is supplied to the common channels 15 through which the ink is supplied to the individual channels 16. Ink in the respective individual channels 16 flows into the corresponding pressure chambers 12 via the communication paths 14. The ink in the pressure chambers 12 is ejected from the nozzles 11 through the communication paths 13 as the piezoelectric actuator 30 is deformed. Deformation of the piezoelectric actuator 30 may cause change in volumes of the pressure chambers 12 and apply pressures to the pressure chambers 12 to eject ink from the nozzles 11.

The pressure chamber 12 is defined by a through-hole formed in the uppermost plate 10a of the channel substrate 10, which includes the plates 10a-10c and 10e. The plate 10a is an example of a pressure chamber substrate as claimed. The pressure chamber 12 has an upper open end.

As depicted in FIG. 3, the piezoelectric actuator 30 includes a diaphragm 31, a common electrode 32, a first piezoelectric body 33, an individual electrode 34, a second piezoelectric body 35, first to third conductive patterns 41-43, plated layers 51 and 52, and a wiring 53.

Positional relationship between elements of the piezoelectric actuator 30 in the thickness direction will now be described. The diaphragm 31 is disposed above the plate 10a (e.g., at one side in the thickness direction) and below the common electrode 32 (e.g., at the other side in thickness direction). The common electrode 32 is disposed above the diaphragm 31 (e.g., at one side in the thickness direction). The first piezoelectric body 33 is disposed above the common electrode 32 (e.g., at one side in the thickness direction). The individual electrode 34 is disposed above the first piezoelectric body 33 (e.g., at one side in the thickness direction). The second piezoelectric body 35 is disposed above the individual electrode 34 (e.g., at one side in the thickness direction). The conductive patterns 41-43 are disposed above second piezoelectric body 35 (e.g., at one side in the thickness direction). The conductive patterns 41-43 are insulated from one another. The first plated layer 51 is disposed above the first conductive pattern 41 (e.g., at one side in the thickness direction). The second plated layer 52 is disposed above the second conductive pattern 42 (e.g., at one side in the thickness direction). The wiring 53 has an end disposed above the third conductive pattern 43 (e.g., at one side in the thickness direction). The conductive patterns 41-43 are electrodes including conductive material. Examples of the conductive material includes metals, such as platinum (Pt) and iridium (Ir).

The piezoelectric actuator 30 includes actuators 30z in correspondence with the respective pressure chambers 12. Each of the actuators 30z includes a portion 30x that is a portion of the first piezoelectric body 33 sandwiched between the common electrode 32 and the individual electrode 34 in the thickness direction, and another portion 30y that is a portion of the second piezoelectric body 35 sandwiched between the second conductive pattern 42 and the individual electrode 34 in the thickness direction.

The diaphragm 31 is bonded to an upper surface of the plate 10a, covering all pressure chambers 12 formed in the plate 10a.

Elements (e.g., the common electrode 32, the first piezoelectric body 33, the individual electrode 34, the second piezoelectric body 35, the conductive patterns 41-43, and the wiring 53) of the piezoelectric actuator 30 other than the diaphragm 31 and the plated layers 51 and 52 constitute a first actuator array 30A and a second actuator array 30B. The first actuator array 30A and the second actuator array 30B respectively correspond to the first pressure chamber array 12A and the second chamber array 12B. The first actuator array 30A and the second actuator array 30B are arranged next to each other in the perpendicular direction.

Referring to FIGS. 4 and 5, manufacturing processes of the piezoelectric actuator 30 after the diaphragm 31 is bonded to the upper surface of the plate 10a will now be described.

Figure 4A:
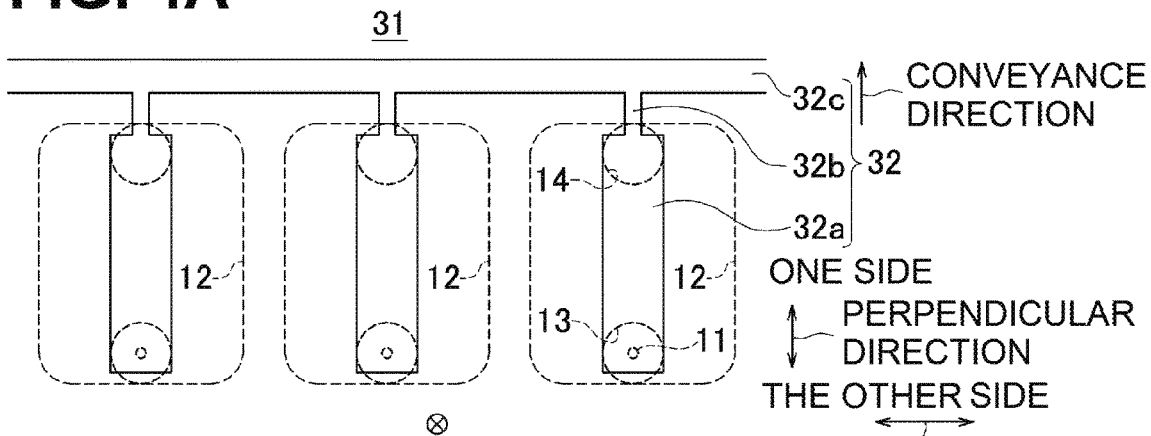
FIGS. 4A-4C are plan views of a region IV of the head of FIG. 2 enclosed by a dot-and-dash line, illustrating manufacturing processes of the piezoelectric actuator.

As depicted in FIG. 4A, the common electrode 32 is formed on an upper surface of the diaphragm 31 by, for example, etching.

The common electrode 32 is provided for the respective actuator array 30A and 30B. The common electrode 32 includes first portions 32a, second portions 32b, and a third portion 32c. Each of the first portions 32a overlaps, in the thickness direction, with a respective one of the pressure chambers 12. Each of the second portions 32b extends in the perpendicular direction from a one-side end, in the perpendicular direction, of the respective first portions 32a. The third portion 32c connects the second portions 32b to each other.

The first portion 32a has a rectangular shape elongated in the perpendicular direction in a plane perpendicular to the thickness direction. The first portion 32a is shorter than the pressure chamber 12 in perpendicular direction and the crossing direction. The first portion 32a entirely overlaps with the pressure chamber 12 in the thickness direction.

The second portion 32b has a rectangular shape elongated in the perpendicular direction in a plane perpendicular to the thickness direction. The second portion 32b is shorter than the first portion 32a in perpendicular direction and the crossing direction. The second portion 32b has a portion that overlaps with the pressure chamber 12 in the thickness direction and another portion that does not overlap with the pressure chamber 12 in the thickness direction.

The third portion 32c does not overlap with the pressure chamber 12 in the thickness direction but extends in the crossing direction along the pressure chamber array 12A, 12B including the pressure chambers 12.

The common electrodes 32 of the first actuator array 30A and the common electrode 32 of the second actuator array 30B are symmetrical with respect to a straight line extending in the crossing direction through the center of the piezoelectric actuator 30 in the perpendicular direction. In the perpendicular direction, all pressure chambers 12 of the pressure chamber arrays 12A and 12B are disposed between the third portion 32c of the common electrode 32 of the first actuator array 30A and the third portion 32c of the common electrode 32 of the second actuator array 30B.

Figure 4B:
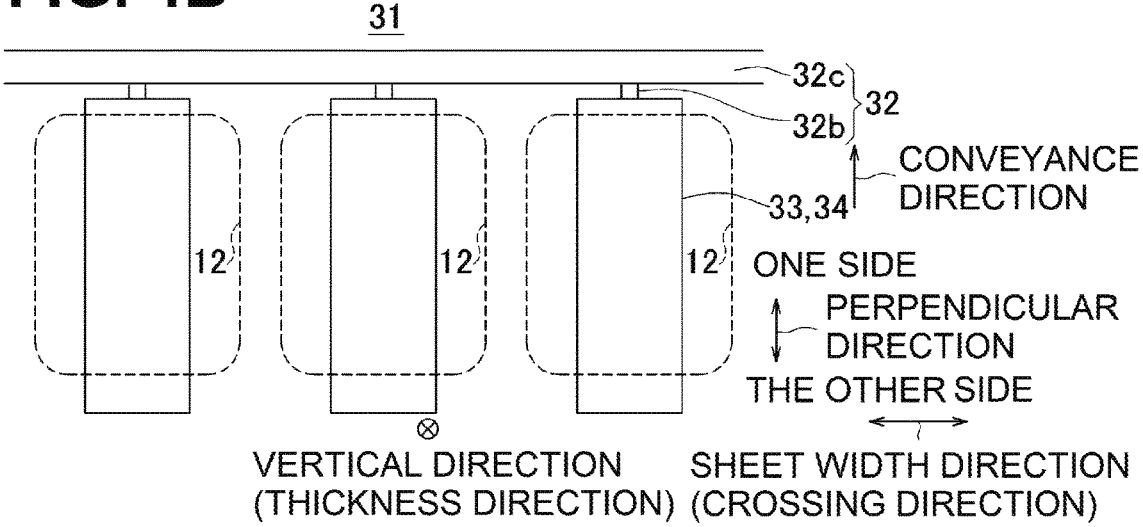

As depicted in FIG. 4B, the first piezoelectric body 33 and the individual electrode 34 are formed by, for example, etching.

The first piezoelectric body 33 and the individual electrode 34 are provided for the respective pressure chamber 12.

The first piezoelectric body 33 has a rectangular shape elongated in the perpendicular direction in a plane perpendicular to the thickness direction. The first piezoelectric body 33 is longer in the perpendicular direction than the first portion 32a and the pressure chamber 12. In the crossing direction, the first piezoelectric body 33 is longer than the first portion 32a but is shorter than the pressure chamber 12. The first piezoelectric body 33 protrudes toward one side and the other side in the perpendicular direction relative to the first portion 32a and the pressure chamber 12. The first piezoelectric body 33 includes a portion that is formed on the upper surfaces of the first portion 32a and the second portion 32b, and another portion formed on the upper surface of the diaphragm 31. The first piezoelectric body 33 has a portion that overlaps with the pressure chamber 12 in the thickness direction and another portion that does not overlap with the pressure chamber 12 in the thickness direction.

The individual electrode 34 is formed on an upper surface of the first piezoelectric body 33. The individual electrode 34 has the same shape as the first piezoelectric body 33 in a plane perpendicular to the thickness direction.

Figure 4C:
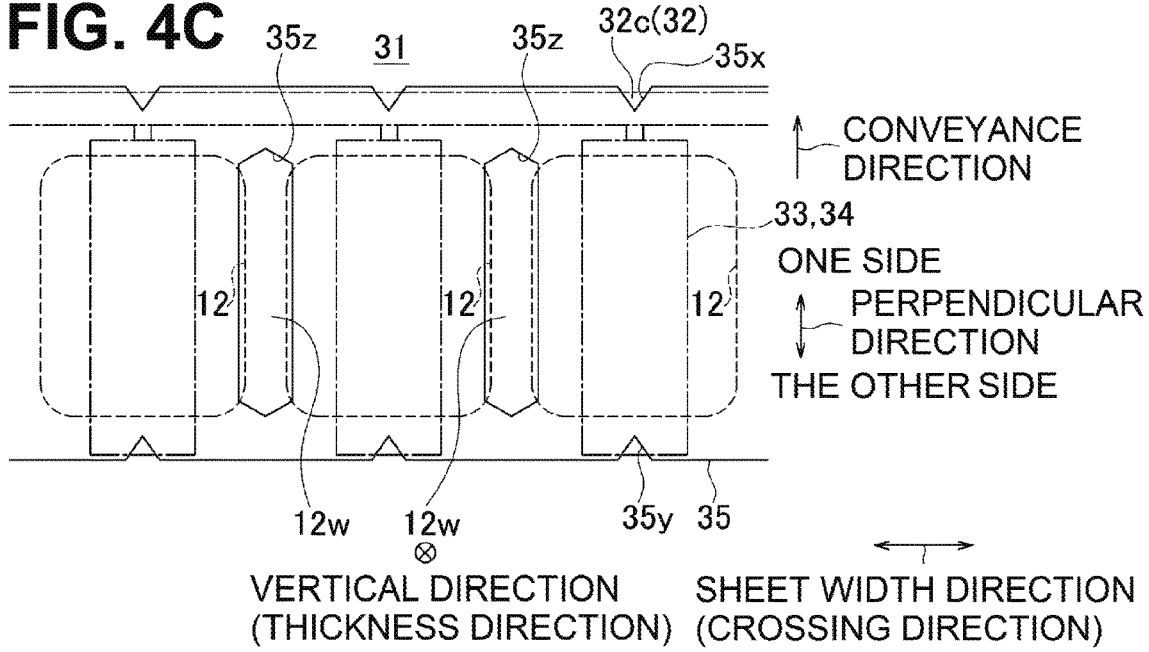

As depicted in FIG. 4C, the second piezoelectric body 35 is formed by, for example, etching.

The second piezoelectric body 35 is provided for the respective actuator array 30A and 30B. The second piezoelectric body 35 extends in the crossing direction. The second piezoelectric body 35 overlaps, in the thickness direction, with all of the pressure chambers 12 of the corresponding pressure chamber array 12A and 12B. The second piezoelectric body 35 is provided above the diaphragm 31, covering the common electrode 32, the first piezoelectric bodies 33, and the individual electrodes 34 of the corresponding actuator array 30A and 30B.

The second piezoelectric body 35 includes recesses, e.g., first notches 35x, provided at one-side end portions thereof in the perpendicular direction, and recesses, e.g., second notches 35y, provided at other-side end portions thereof in the perpendicular direction. The third portion 32c of the common electrode 32 is exposed through the first notches 35x. The individual electrodes 34 are exposed through the second notches 35y.

The second piezoelectric body 35 has a slit 35z at a portion overlapping, in the thickness direction, with a partition wall 12w between the pressure chambers 12. The partition wall 12w is a portion of the plate 10a (refer to FIG. 3) between the pressure chambers 12 adjacent to each other in the crossing direction. The slit 35z extends through the second piezoelectric body 35 in the thickness direction. The slit 35z is longer in the crossing direction than the partition wall 12w and overlaps with an end of the pressure chamber 12 in the crossing direction.

As depicted in FIG. 5A, the first to third conductive patterns 41-43 are formed on an upper surface of the second piezoelectric body 35 by, for example, etching. The third conductive patterns 43 constitute a third conductive pattern array as claimed.

The first conductive pattern 41, the second conductive pattern 42, and the third conductive patterns 43 are provided for the respective actuator array 30A and 30B.

In each actuator array 30A and 30B, the first conductive pattern 41 and the second conductive pattern 42 extend in the crossing direction, and the third conductive patterns 43 are arranged or aligned in the crossing direction. In each actuator array 30A and 30B, the second conductive pattern 42 is disposed between the first conductive pattern 41 and at least one third conductive pattern 43 in the perpendicular direction. In FIG. 5A, the first conductive pattern 41 is disposed at one side of the second conductive pattern 42 in the perpendicular direction and the third conductive patterns 43 are disposed at the other side of the second conductive pattern 42 in the perpendicular direction.

The first conductive pattern 41 overlaps with the third portion 32c of the common electrode 32 in the thickness direction. The first conductive pattern 41 electrically connects to the third portion 32c, via the first notches 35x formed in the second piezoelectric body 35. In one example, as depicted in FIG. 3, the first conductive pattern 41 contacts the common electrode 32 at the first notch 35x. The first conductive pattern 41 does not electrically connect to the individual electrodes 34.

The second conductive pattern 42 is longer in the perpendicular direction than the pressure chamber 12. The second conductive pattern 42, the first portions 32a, the first piezoelectric bodies 33, and the individual electrodes 34, overlap, in the thickness direction, with the pressure chambers 12. The second conductive pattern 42 overlaps, in the thickness direction, with a portion of the second piezoelectric body 35 between the first notches 35x and the second notches 35y in the perpendicular direction. The second conductive pattern 42 does not electrically connect to either the common electrode 32 or the individual electrodes 34.

In FIG. 5A, the third conductive pattern 43 overlaps, in the thickness direction, with aft another-side end portion of the respective individual electrode 34. The third conductive pattern 43 electrically connects to the individual electrode 34, via the second notch 35y formed in the second piezoelectric body 35. In one example, as depicted in FIG. 3, the third conductive pattern 43 contacts the individual electrode 34 at the second notch 35y. The third conductive pattern 43 does not electrically connect to the common electrode 32.

As depicted in FIG. 2, the second conductive patterns 42 of the first and the second actuator arrays 30A and 30B, and the third conductive patterns 43 of the first and the second actuator arrays 30A and 30B are disposed between the first conductive patterns 41 of the first and the second actuator arrays 30A and 30B, in the perpendicular direction.

In the crossing direction, one third conductive pattern 43 of the second actuator array 30B is disposed between two third conductive patterns 43 of the first actuator array 30A, and one third conductive pattern 43 of the first actuator array 30A is disposed between two third conductive patterns 43 of the second actuator array 30B. The third conductive pattern 43 of the first actuator array 30A is spaced, in the perpendicular direction, from the third conductive pattern 43 of the second actuator array 30B. In other words, the third conductive patterns 43 of the first and the second actuator arrays 30A and 30B are arranged in the crossing direction in a staggered manner.

The piezoelectric actuator 30 further includes two first connecting patterns 61 and two second connecting pattern 62. Each of the first connecting patterns 61 connects the first conductive pattern 41 of the first actuator array 30A and the first conductive pattern 41 of the second actuator array 30B to each other. Each of the second connecting patterns 62 connects the second conductive pattern 42 of the first actuator array 30A and the second conductive pattern 42 of the second actuator array 30B to each other.

One of the first connecting patterns 61 connects to one-side ends, in the crossing direction, of the first conductive patterns 41 of the actuator arrays 30A and 30B. The other one of the first connecting patterns 61 connects to other-side ends, in the crossing direction, of the first conductive patterns 41 of the actuator arrays 30A and 30B. Each first connecting pattern 61 includes a first protruding portion 41$p$ that protrudes toward one side in the perpendicular direction from the first conductive pattern 41 of the first actuator array 30A, and another first protruding portion 41$p$ that protrudes toward the other side in the perpendicular direction from the first conductive pattern 41 of the second actuator array 30B. The two first protruding portions 41$p$ are connected to each other.

One of the second connecting patterns 62 connects to one-side ends, in the crossing direction, of the second conductive patterns 42 of the actuator arrays 30A and 30B. The other one of the second connecting patterns 62 connects to other-side ends, in the crossing direction, of the second conductive patterns 42 of the actuator arrays 30A and 30B. Each second connecting pattern 62 includes a second protruding portion 42$p$ that protrudes toward one side in the perpendicular direction from the second conductive pattern 42 of the first actuator array 30A, and another second protruding portion 42$p$ that protrudes toward the other side in the perpendicular direction from the second conductive pattern 42 of the second actuator array 30B. The two second protruding portions 42$p$ are connected to each other.

In addition to the common electrode 32, the first piezoelectric bodies 33, the individual electrodes 34, the second piezoelectric body 35, the conductive patterns 41-43, the plated layers 51 and 52, and the wirings 53, each of the actuator arrays 30A and 30B includes the two first protruding portions 41$p$ that protrude from a one-side end and another-side end, in the crossing direction, of the first conductive pattern 41, and the two second protruding portions 42$p$ that protrude from a one-side end and another-side end, in the crossing direction, of the second conductive pattern 42. The first protruding portions 41$p$ and the second protruding portions 42$p$ of the respective actuator arrays 30A and 30B are located between the first conductive pattern 41 of the first actuator array 30A and the first conductive pattern 41 of the second actuator array 30B in the perpendicular direction. In each actuator array 30A and 30B, the first protruding portions 41$p$, the second protruding portions 42$p$, and the third conductive patterns 43 are arranged in the crossing direction.

In the whole actuator arrays 30A and 30B, the first connecting patterns 61, the second connecting patterns 62, and the third conductive patterns 43 are arranged in the crossing direction. The first connecting patterns 61 and the second connecting patterns 62 are disposed to each side, in the crossing direction, of a region of an array of the third conductive patterns 43 (e.g., a region of the third conductive pattern array). In the crossing direction, the two second connecting patterns 62 are disposed between the two first connecting patterns 61, and the multiple third conductive patterns 43 are disposed between the two second connecting patterns 62.

The connecting patterns 61 and 62 are formed at the same time as the conductive patterns 41-43.

Subsequently, as depicted in FIG. 5B, the plated layers 51 and 52 and the wirings 53 are formed.

The first plated layer 51 includes portions formed on upper surfaces of the first conductive patterns 41 of the respective actuator arrays 30A and 30B, and another portions formed on upper surfaces of the two first connecting patterns 61 (refer to FIG. 2). The first plated layer 51 surrounds the region of the array of the third conductive patterns 43 in a plane perpendicular to the thickness direction. In other words, the first plated layer 51 has a rectangular shape in a plane perpendicular to the thickness direction.

The second plated layer 52 includes portions 52$a$ and 52$b$ formed on upper surfaces of the second conductive patterns 42 of the respective actuator arrays 30A and 30B, and another portions formed on upper surfaces of the two second connecting patterns 62 (refer to FIG. 2). The second plated layer 52 has a generally rectangular shape in a plane perpendicular to the thickness direction.

In FIG. 5B, the first portion 52$a$ is disposed at one side, in the perpendicular direction, of the pressure chambers 12. The first portion 52$a$ does not overlap with the pressure chambers 12 in the thickness direction. The second portion 52$b$ is disposed at the other side, in the perpendicular direction, of the pressure chambers 12. The second portion 52$b$ does not overlap with the pressure chambers 12 in the thickness direction. The portions 52$a$ and 52$b$ are connected at both ends in the crossing direction and are connected to the two second connecting patterns 62 (refer to FIG. 2).

The wiring 53 is provided in correspondence with the respective third conductive pattern 43 and electrically connects to the third conductive pattern 43. The wiring 53 has one end disposed on the upper surface of the third conductive pattern 43 and an opposite end disposed on an upper surface of a central portion, in the perpendicular direction, of the diaphragm 31. In FIG. 5B, the wiring 53 extends toward the other side in the perpendicular direction from the respective third conductive pattern 43. As depicted in FIG. 2, the wirings 53 connected to the respective third conductive patterns 43 of the first actuator array 30A and the wirings 53 connected to the respective third conductive patterns 43 of the second actuator array 30B are arranged in the crossing direction in a staggered manner.

In a plane perpendicular to the thickness direction, the wirings 53 are surrounded by the second plated layer 52 which is surrounded by the first plated layer 51.

Through the above-described processes, the piezoelectric actuator 30 is produced.

FIG. 2 does not show the plated layers 51, 52. FIGS. 4B, 4C, 5A, and 5B do not show some elements of the channel substrate 10 other than the pressure chambers 12 (e.g., the nozzles 11 and the communication paths 13, 14). FIGS. 5A and 5B do not show the first piezoelectric bodies 33.

The wiring substrate 90 includes a chip on film ("COF"). The wiring substrate 90 has one end (refer to FIGS. 2 and 3) fixed at a central portion of the piezoelectric actuator 30 in the perpendicular direction, and an opposite end connected to the controller 5 (refer to FIGS. 1 and 6). The driver IC 1$d$ is mounted to a portion between the one end and the opposite end of the wiring substrate 90 (refer to FIG. 3).

As depicted in FIG. 2, the one end of the wiring substrate 90 extends in the crossing direction and is connected to the first connecting patterns 61, the second connecting patterns 62, and the wirings 53. The wiring substrate 90 includes wirings (not depicted) that electrically connect to the first connecting patterns 61, another wirings (not depicted) that electrically connect to the second connecting patterns 62, and wirings 93 (refer to FIG. 3) that electrically connect to the respective wirings 53. Those wirings electrically connect to the driver IC 1d. Among the wirings, the wirings that electrically connect to the second connecting patterns 62 are grounded.

The driver IC 1d is configured, based on control signals from the controller 5, to apply a first pulse signal P1 (refer to FIG. 7B) and a second pulse signal P2 (refer to FIG. 7C) while maintaining the second connecting patterns 62 (and the second conductive patterns 42) at a ground potential (0 V) (refer to FIG. 7A). The first pulse signal P1 is applied to the wirings 53 (and the third conductive patterns 43). The first pulse signal P1 is constituted by a high potential (e.g., 20 V) and a low potential (e.g., 0 V) lower than the high potential. The second pulse signal P2 is applied to the first connecting patterns 61 (and the first conductive patterns 41). The second pulse signal P2 is constituted by the ground potential (0 V) and a negative potential (e.g., −3 V). When the high potential is applied to the third conductive patterns 43 with the first pulse signal P1 (during a period "A" as depicted in FIGS. 7A-7C), the ground potential is applied with the second pulse signal P2. When the low potential is applied to the third conductive patterns 43 with the first pulse signal P1 (during a period "B" as depicted in FIGS. 7A-7C), the negative potential is applied with the second pulse signal P2. The negative potential does not exceed a coercive electric field of the actuator 30z.

Figure 8A:
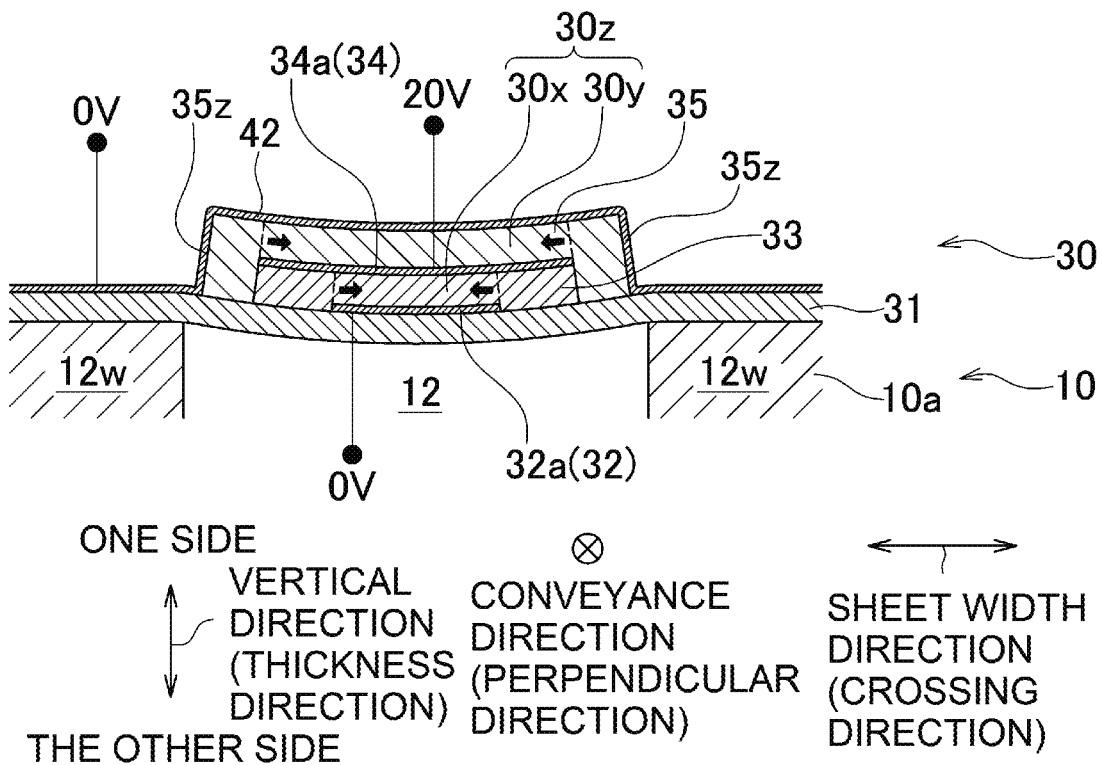
FIGS. 8A and 8B are cross-sectional views of the piezoelectric actuator, taken along a line VIII-VIII in FIG. 2, illustrating deformations of the piezoelectric actuator.

As depicted in FIG. 8A, during the period "A", the portions 30x and 30y contract in a direction perpendicular to the thickness direction. This may cause a portion of the piezoelectric actuator 30 overlapping with the pressure chamber 12 in the thickness direction to deform downward toward the pressure chamber 12 (to be downwardly convex). At this time, a volume of the pressure chamber 12 is smaller than that when the diaphragm 31 and the piezoelectric bodies 33 and 35 are flat.

Figure 8B:
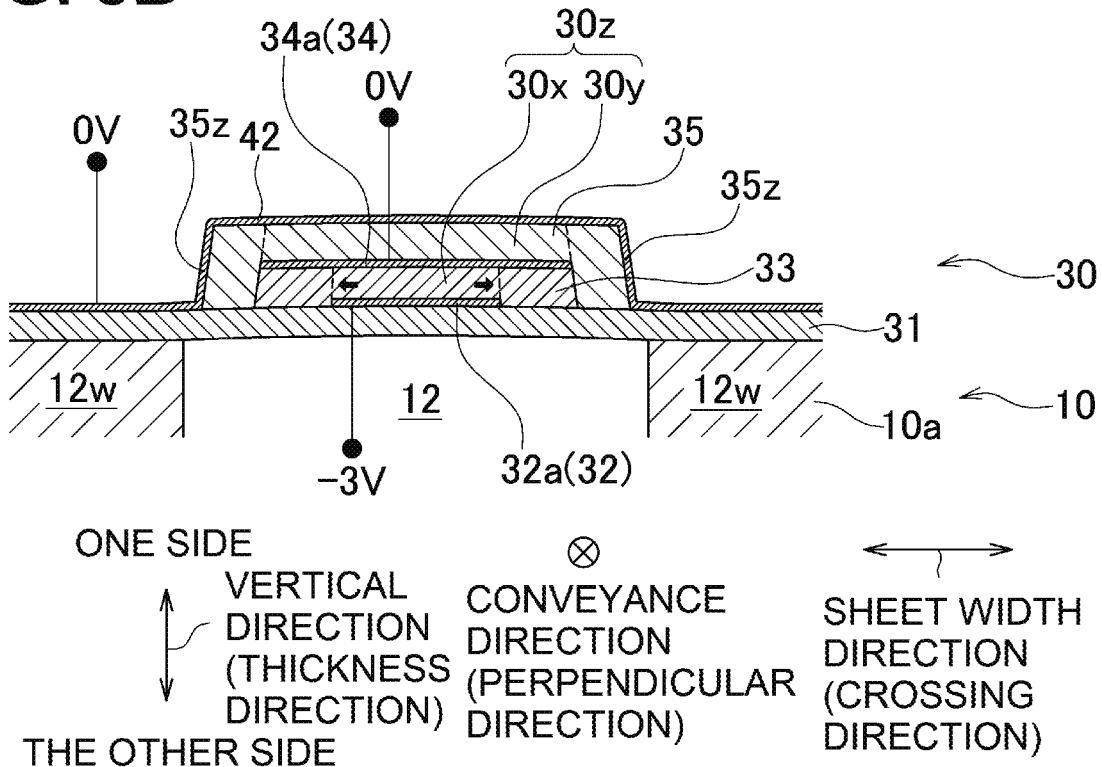

As depicted in FIG. 8B, during the period "B", the contraction of the portion 30x is eliminated while the portion 30y slightly expands in the direction perpendicular to the thickness direction. This may cause a portion of the piezoelectric actuator 30 overlapping with the pressure chamber 12 in the thickness direction to bend slightly in a direction away from the pressure chamber 12 (to be upwardly convex). At this time, the volume of the pressure chamber 12 is slightly greater than that when the diaphragm 31 and the piezoelectric bodies 33 and 35 are flat.

Before a recording process, each actuator 30z may be maintained in such a state as depicted in FIG. 8A. As the recording process starts, the state of a desirable actuator 30z (corresponding to the nozzle 11 from which ink is to be ejected) may change from the state as depicted in FIG. 8A to the state as depicted in FIG. 8B and then back to the state as depicted in FIG. 8A, thereby applying pressures to the pressure chamber 12. This may cause the ink in the pressure chamber 12 to be ejected from the corresponding nozzle 11.

The slits 35z are formed in the second piezoelectric body 35 and the piezoelectric bodies 33, 35 are not disposed on the partition walls 12w. This configuration may allow the actuator 30z to deform readily. The second conductive pattern 42 is provided in the slits 35z but the common electrode 32 and the individual electrode 34 are not provided in the slits 35z.

As described above, in the illustrative embodiment, the first conductive pattern 41 and the third conductive patterns 43 in each actuator array 30A, 30B are opposite to each other in the perpendicular direction relative to the second conductive pattern 42 (refer to FIG. 5A). In the perpendicular direction, the second conductive pattern 42 of the first actuator array 30A and the second conductive pattern 42 of the second actuator array 30B are disposed between the first conductive pattern 41 of the first actuator array 30A and the first conductive pattern 41 of the second actuator array 30B. Further, in the perpendicular direction, the third conductive patterns 43 of the first actuator array 30A and the third conductive patterns 43 of the second actuator array 30B are disposed between the second conductive pattern 42 of the first actuator array 30A and the second conductive pattern 42 of the second actuator array 30B. If the first conductive pattern 41 and the third conductive patterns 43 of each actuator array 30A, 30B should be located on the same side of the actuator array 30A, 30B in the perpendicular direction relative to the second conductive pattern 42, an insulation layer would be required between the first conductive pattern 41 and the third conductive patterns 43, which may lead to a complicated configuration of the piezoelectric actuator 30. Additionally, the distance between the first conductive pattern 41 and the third conductive patterns 43 may be reduced, which may lead to decrease in the electrical reliability. In illustrative embodiment, the first conductive pattern 41 and the third conductive patterns 43 of each actuator array 30A, 30B are located opposite to each other in the perpendicular direction relative to the second conductive pattern 42. Accordingly, occurrences of the above-described issues may be prevented or reduced. In other words, the configuration of the piezoelectric actuator 30 may be simplified and the electrical reliability may increase.

In each actuator array 30A and 30B, the first protruding portions 41p, the second protruding portions 42p, and the third conductive patterns 43 are arranged in the crossing direction (refer to FIG. 2). This configuration may allow one wiring substrate 90 to be fixed at a region of the piezoelectric actuator 30 where the first protruding portions 41p, the second protruding portions 42p, and the third conductive patterns 43 are arranged in the crossing direction. As compared with a configuration in which a wiring substrate is individually provided for the conductive patterns 41-43, the configuration of the illustrative embodiment may reduce the number of components to be used and facilitate the manufacturing of the piezoelectric actuator 30.

Disposed between the first conductive pattern 41 of the first actuator array 30A and the first conductive pattern 41 of the second actuator array 30B in the perpendicular direction are the second conductive pattern 42 of the first actuator array 30A, the second conductive pattern 42 of the second actuator array 30B, the third conductive patterns 43 of the first actuator array 30A, the third conductive patterns 43 of the second actuator array 30B, the first protruding portions 41p of the first actuator array 30A, the first protruding portions 41p of the second actuator array 30B, the second protruding portions 42p of the first actuator array 30A, and the second protruding portions 42p of the second actuator array 30B (refer to FIG. 2). In this configuration, one wiring substrate 90 may be fixed at a region between the first conductive pattern 41 of the first actuator array 30A and the first conductive pattern 41 of the second actuator array 30B. This configuration may reduce the number of components to be used and facilitate the manufacturing of the piezoelectric actuator 30, as compared with a configuration in which a wiring substrate is individually provided for the actuator arrays 30A, 30B.

The first protruding portions 41p of the first actuator array 30A and the first protruding portions 41p of the second actuator array 30B are connected to each other. The second protruding portions 42p of the first actuator array 30A and the second protruding portions 42p of the second actuator array 30B are connected to each other (refer to FIG. 2). A compared with a configuration in which the protruding portions are separated from each other, the configuration of the illustrative embodiment may reduce the size of a region, where the wiring substrate 90 is fixed, in the perpendicular direction, as well as the cost of the wiring substrate 90 because the wiring substrate 90 is not be excessively widened.

In the whole actuator arrays 30A and 30B, the first connecting patterns 61, the second connecting patterns 62, and the third conductive patterns 43 are arranged in the crossing direction (refer to FIG. 2). This configuration may allow one wiring substrate 90 to be fixed at a region of the piezoelectric actuator 30 where the first connecting patterns 61, the second connecting patterns 62, and the third conductive patterns 43 are arranged in the crossing direction. As compared with a configuration in which a wiring substrate is individually provided for the actuator arrays 30A and 30B, the configuration of the illustrative embodiment may reduce the number of components to be used and facilitate the manufacturing of the piezoelectric actuator 30.

The piezoelectric actuator 30 includes a plurality of the first connecting patterns 61 and a plurality of the second connecting patterns 62 (refer to FIG. 2). This configuration may provide a plurality of contacts to the wiring substrate 90, thereby preventing or reducing voltage drop of the first and second conductive patterns 41 and 42 of the actuator arrays 30A and 30B.

The first conductive pattern 41 electrically connects to the common electrode 32 via the first notches 35x formed in the second piezoelectric body 35. The third conductive patterns 43 electrically connect to the individual electrodes 34 via the second notches 35y formed in the second piezoelectric body 35. The second conductive pattern 42 overlaps, in the thickness direction, with a portion of the second piezoelectric body 35 between the first notches 35x and the second notches 35y in the perpendicular direction (refer to FIG. 5A). Thus, such configuration may be effectively achieved that the first conductive pattern 41 and the third conductive patterns 43 are located opposite to each other in the perpendicular direction relative to the second conductive pattern 42.

The piezoelectric actuator 30 further includes the first plated layer 51 disposed at one side of the first conductive pattern 41 in the thickness direction (refer to FIGS. 3 and 5B). This configuration may reduce electrical resistance and voltage drop of the first conductive pattern 41, which may reduce differences in the applied voltage between the actuators 30z, and ink ejection variances.

The diaphragm 31 is disposed at the other side of the common electrode 32 in the thickness direction (refer to FIG. 3). This configuration may facilitate operations of wiring the conductive patterns 41-43.

The piezoelectric actuator 30 further includes the second plated layer 52 disposed at the one side of the second conductive pattern 42 in the thickness direction (refer to FIGS. 3 and 5B). This configuration may reduce electrical resistance and voltage drop of the second conductive pattern 42, which may reduce differences in the applied voltage between the actuators 30z, and ink ejection variances. If a portion of the second conductive pattern 42 overlapping with the pressure chamber 12 has a plated layer, the actuator 30z may be not deform as intended. In the illustrative embodiment, the second plated layer 52 is provided at a portion of the second conductive pattern 42 that does not overlap with the pressure chamber 12 in the thickness direction. This configuration may not prevent the deformation of the actuator 30z.

The second plated layer 52 is grounded. This may ensure electrical reliability of the second conductive patterns 42 and eliminate the necessity of forming a protection film for the second conductive patterns 42.

The controller 5 maintains the second conductive patterns 42 at the ground potential, and applies the first pulse signal P1 to the third conductive patterns 43 and the second pulse signal P2 to the first conductive patterns 41. The piezoelectric bodies 33 and 35 formed by sol-gel deposition tend to have tensile stress. The electrodes 32, 34 and the conductive patterns 41-43 including precious metal, e.g., Pt, may have tensile stress, for example, due to heat treatment for crystallization. In a case where the piezoelectric bodies 33, 35, the electrodes 32, 34, and/or the conductive patterns 41-43 have tensile stress, the first pulse signal P1 may be applied to the third conductive patterns 43 while the first conductive pattern 41 and the second conductive pattern 42 are maintained at the ground potential. This may cause a portion of the piezoelectric actuator 30 overlapping with the pressure chamber 12 in the thickness direction to deform downward toward the pressure chamber 12 (to be downwardly convex) during the period "B". In the subsequent period "A", it may be difficult to increase an amount of deformation of the actuator 30z. In the configuration of the illustrative embodiment, application of the negative potential to the first conductive patterns 41 during the period "B" may cause a portion of the piezoelectric actuator 30 overlapping with the pressure chamber 12 in the thickness direction to deform slightly in a direction away from the pressure chamber 12 (to be upwardly convex). This may reduce the deformation of the piezoelectric actuator 30 in the direction toward the pressure chamber 12 due to the tensile stress and increase an amount of deformation of the actuator 30z during the period "A" subsequent to the period "B".

The controller 5 maintains the second conductive patterns 42 at the ground potential, and applies the second pulse signal P2 to the first conductive patterns 41 (refer to FIGS. 7A and 7C). The conductive patterns 41-43 are exposed without being covered by the piezoelectric bodies. The exposed conductive patterns may be subjected to a change in quality due to contact to the air, and may be more subjected to a change in quality with an application of pulse signals. Especially, change in the quality of the second conductive pattern 42, which overlaps with the pressure chambers 12 in the thickness direction and constitutes of a part of the actuator 30z, may affect the deformation of the actuator 30z. In the illustrative embodiment, the second conductive patterns 42 are maintained at the ground potential, so that a change in the quality of the second conductive pattern 42 may be prevented or reduced.

<Modifications>

While aspects of the disclosure have been described in detail with reference to the specific embodiment thereof, various changes, arrangements and modifications may be applied therein as will be described below.

For example, the piezoelectric actuator may include one first connecting pattern and one second connecting pattern.

Figure 9:
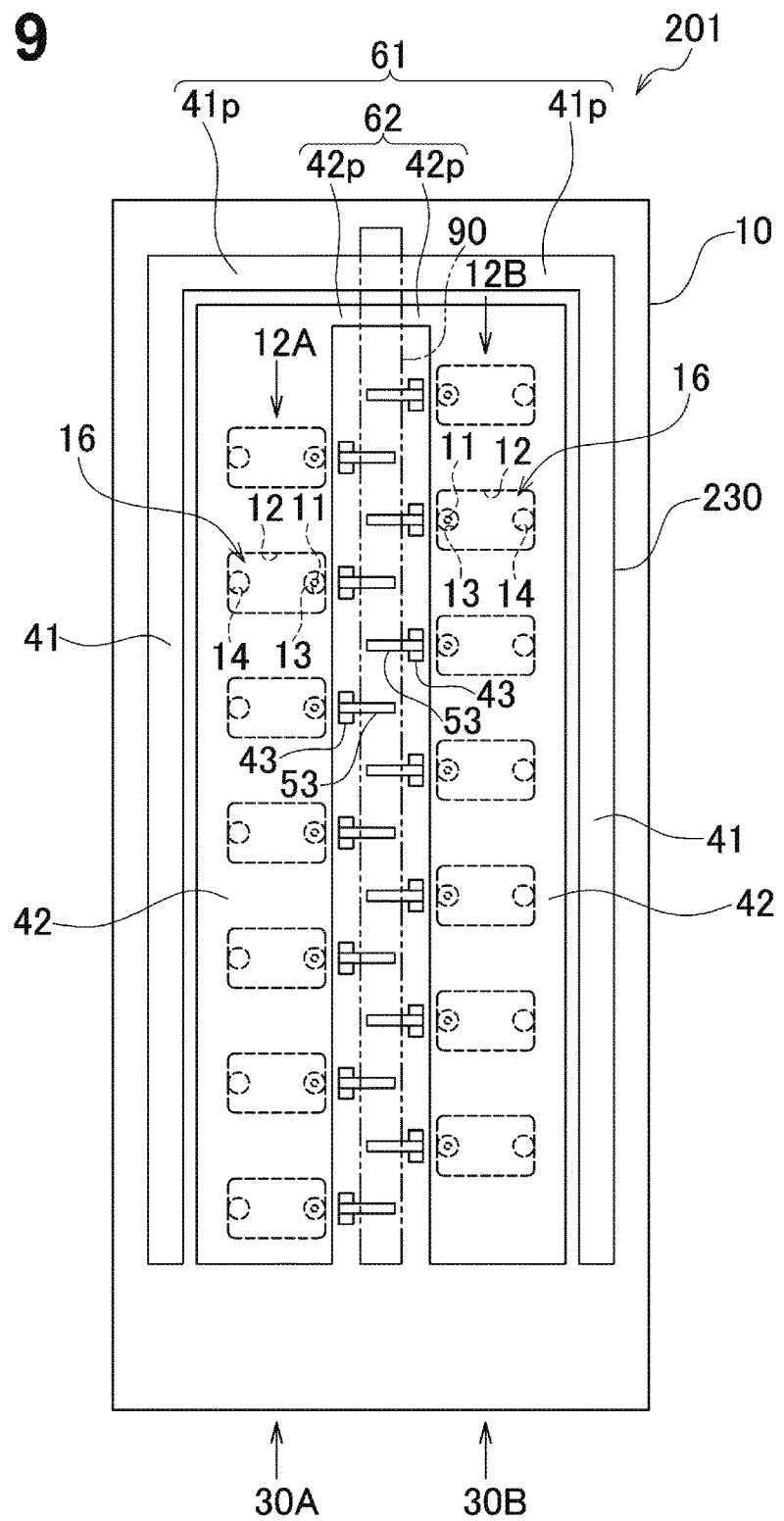
FIG. 9 is a plan view of a head including a piezoelectric actuator in a modification according to aspects of the disclosure.

More specifically, configuration of a piezoelectric actuator is not limited to that of the piezoelectric actuator 30 of the head 1, as depicted in FIG. 2, that includes two first connecting patterns 61 and two second connecting patterns 62. For example, in a modification as depicted in FIG. 9, a piezoelectric actuator 230 of a head 201 includes one first connecting pattern 61 and one second connecting pattern 62. In FIG. 2, the protruding portions 41p protrude from one-side ends and the other-side ends, in the crossing direction, of the first conductive patterns 41, and the protruding portions 42p protrude from one-side ends and the other-side ends, in the crossing direction, of the second conductive patterns 42. In contrast, in FIG. 9, the protruding portions 41p protrude from one-side ends, in the crossing direction, of the first conductive patterns 41, and the protruding portions 42p protrude from one-side ends, in the crossing direction, of the second conductive patterns 42. Any protruding portions do not protrude from other-side ends of the first conductive patterns 41 or the second conductive patterns 42.

The first protruding portion of the first actuator array and the first protruding portion of the second actuator array may be separated from each other. The second protruding portion of the first actuator array and the second protruding portion of the second actuator array may also be separated from each other.

The wiring substrate may be provided individually for the first actuator array and the second actuator array. Further, the wiring substrate may be provided individually for the first, second, and third conductive patterns.

The piezoelectric actuator may include one actuator array instead of including a plurality of actuator arrays.

The second plated layer may be disposed at a portion overlapping with the pressure chamber in thickness direction. The piezoelectric actuator may not necessarily include the first plated layer or the second plated layer.

The controller may maintain the first conductive patterns at the ground potential and apply the second pulse signal to the second conductive patterns. In this configuration, a protection film may preferably be formed on the second conductive pattern to prevent changes in quality of the second conductive patterns.

The diaphragm may be disposed at the other side of the first to third conductive patterns in the thickness direction. In one example, the diaphragm, the first to third conductive patterns, the second piezoelectric body, the individual electrode, the first piezoelectric body, and the common electrode may be laminated in the thickness direction in this order from a side closer to the pressure chamber.

Aspects of the disclosure may be applied to, for example, facsimile machines, copiers, and multi-functional devices other than printers. Aspects of the disclosure may be applied to a liquid ejection apparatus used for a purpose other than image recording (e.g., a liquid ejection apparatus that forms a conductive pattern by ejecting conductive liquid on a substrate). The piezoelectric actuator according to aspects of the disclosure may be applied to apparatuses other than a liquid ejection apparatus.

What is claimed is:

1. A piezoelectric actuator, comprising:
    a common electrode;
    a first piezoelectric body disposed at one side of the common electrode in a thickness direction of the common electrode;
    an individual electrode disposed at one side of the first piezoelectric body in the thickness direction;
    a second piezoelectric body disposed at one side of the individual electrode in the thickness direction;
    a first conductive pattern disposed at one side of the second piezoelectric body in the thickness direction;
    a second conductive pattern disposed at the one side of the second piezoelectric body in the thickness direction, the second conductive pattern being insulated from the first conductive pattern; and
    a third conductive pattern disposed at the one side of the second piezoelectric body in the thickness direction, the third conductive pattern being insulated from the first conductive pattern and the second conductive pattern,
    wherein the first conductive pattern electrically connects to the common electrode, and does not electrically connect to the individual electrode,
    the second conductive pattern does not electrically connect to either the common electrode or the individual electrode,
    the third conductive pattern does not electrically connect to the common electrode, and electrically connects to the individual electrode,
    the first conductive pattern is disposed at one side of the second conductive pattern in a perpendicular direction that is perpendicular to the thickness direction,
    the third conductive pattern is disposed at another side of the second conductive pattern in the perpendicular direction, and
    the second conductive pattern is disposed between the first conductive pattern and the third conductive pattern in the perpendicular direction.

2. The piezoelectric actuator according to claim 1, wherein the third conductive pattern is included in a third conductive pattern array including a plurality of third conductive patterns arranged in a crossing direction that is perpendicular to the thickness direction and crosses the perpendicular direction,
    each of the first conductive pattern and the second conductive pattern extends in the crossing direction,
    the piezoelectric actuator further comprises:
        a first protruding portion protruding in the perpendicular direction from at least one of a one-side end and another-side end of the first conductive pattern in the crossing direction; and
        a second protruding portion protruding in the perpendicular direction from at least one of a one-side end and another-side end of the second conductive pattern in the crossing direction, and
    the first protruding portion, the second protruding portion, and the plurality of third conductive patterns of the third conductive pattern array are arranged in the crossing direction.

3. The piezoelectric actuator according to claim 2, further comprising a first actuator array and a second actuator array arranged next to the first actuator array in the perpendicular direction,
    wherein the first actuator array includes:
        the first conductive pattern;
        the second conductive pattern;
        the third conductive pattern array including the plurality of third conductive patterns arranged in the crossing direction;
        the first protruding portion; and
        the second protruding portion,
    wherein the second actuator array includes:
        the first conductive pattern;
        the second conductive pattern;

the third conductive pattern array including the plurality of third conductive patterns arranged in the crossing direction;
the first protruding portion; and
the second protruding portion, and
wherein the second conductive pattern of the first actuator array, the second conductive pattern of the second actuator array, the third conductive pattern array of the first actuator array, the third conductive pattern array of the second actuator array, the first protruding portion of the first actuator array, the first protruding portion of the second actuator array, the second protruding portion of the first actuator array, and the second protruding portion of the second actuator array are disposed between the first conductive pattern of the first actuator array and the first conductive pattern of the second actuator array, in the perpendicular direction.

4. The piezoelectric actuator according to claim 3, wherein the first protruding portion of the first actuator array and the first protruding portion of the second actuator array are connected to each other, and
the second protruding portion of the first actuator array and the second protruding portion of the second actuator array are connected to each other.

5. The piezoelectric actuator according to claim 1, wherein the second piezoelectric body includes a first recess provided at a one-side end portion thereof in the perpendicular direction, and a second recess provided at another-side end portion thereof in the perpendicular direction,
the first conductive pattern electrically connects to the common electrode via the first recess,
the third conductive pattern electrically connects to the individual electrode via the second recess, and
the second conductive pattern overlaps, in the thickness direction, with a portion of the second piezoelectric body between the first recess and the second recess in the perpendicular direction.

6. The piezoelectric actuator according to claim 1, further comprising a first plated layer disposed at one side of the first conductive pattern in the thickness direction.

7. The piezoelectric actuator according to claim 1, further comprising a diaphragm disposed at another side of the common electrode in the thickness direction.

8. A liquid ejection apparatus, comprising:
a pressure chamber substrate having a pressure chamber formed therein;
a diaphragm disposed at one side of the pressure chamber substrate in a thickness direction, the diaphragm covering the pressure chamber;
a common electrode disposed at one side of the diaphragm in the thickness direction;
a first piezoelectric body disposed at one side of the common electrode in the thickness direction;
an individual electrode disposed at one side of the first piezoelectric body in the thickness direction;
a second piezoelectric body disposed at one side of the individual electrode in the thickness direction;
a first conductive pattern disposed at one side of the second piezoelectric body in the thickness direction;
a second conductive pattern disposed at the one side of the second piezoelectric body in the thickness direction, the second conductive pattern being insulated from the first conductive pattern; and
a third conductive pattern disposed at the one side of the second piezoelectric body in the thickness direction, the third conductive pattern being insulated from the first conductive pattern and the second conductive pattern,
wherein the first conductive pattern electrically connects to the common electrode, and does not electrically connect to the individual electrode,
the second conductive pattern does not electrically connect to either the common electrode or the individual electrode,
the second conductive pattern, the common electrode, and the individual electrode overlap, in the thickness direction, with the pressure chamber,
the third conductive pattern does not electrically connect to the common electrode, and electrically connects to the individual electrode,
the first conductive pattern is disposed at one side of the second conductive pattern in a perpendicular direction that is perpendicular to the thickness direction,
the third conductive pattern is disposed at another side of the second conductive pattern in the perpendicular direction, and
the second conductive pattern is disposed between the first conductive pattern and the third conductive pattern in the perpendicular direction.

9. The liquid ejection apparatus according to claim 8, further comprising a second plated layer disposed at one side of the second conductive pattern in the thickness direction, the second plated layer being provided at a portion of the second conductive pattern that does not overlap with the pressure chamber in the thickness direction.

10. The liquid ejection apparatus according to claim 9, wherein the second plated layer is grounded.

11. The liquid ejection apparatus according to claim 8, further comprising a controller configured to:
maintain one of the first conductive pattern and the second conductive pattern at ground potential;
apply, to the third conductive pattern, a first pulse signal constituted by a high potential and a low potential that is lower than the high potential; and
apply, to the other one of the first conductive pattern and the second conductive pattern, a second pulse signal constituted by the ground potential that is applied when the high potential is applied to the third conductive pattern, and a negative potential that is applied when the low potential is applied to the third conductive pattern.

12. The liquid ejection apparatus according to claim 11, wherein the controller is configured to maintain the second conductive pattern at the ground potential and to apply the second pulse signal to the first conductive pattern.

13. A piezoelectric actuator, comprising:
a first actuator array; and
a second actuator array,
wherein the first actuator array includes:
a common electrode;
a first piezoelectric body disposed at one side of the common electrode in a thickness direction of the common electrode;
an individual electrode disposed at one side of the first piezoelectric body in the thickness direction;
a second piezoelectric body disposed at one side of the individual electrode in the thickness direction;
a first conductive pattern disposed at one side of the second piezoelectric body in the thickness direction;
a second conductive pattern disposed at the one side of the second piezoelectric body in the thickness direction, the second conductive pattern being insulated from the first conductive pattern; and a third conductive pattern disposed at the one side of the second piezoelectric body in the thickness direction, the third conductive pattern being insulated from the first conductive pattern and the second conductive pattern, wherein the second actuator array includes:

a common electrode;

a first piezoelectric body disposed at one side of the common electrode of the second actuator array in the thickness direction;

an individual electrode disposed at one side of the first piezoelectric body of the second actuator array in the thickness direction;

a second piezoelectric body disposed at one side of the individual electrode of the second actuator array in the thickness direction;

a first conductive pattern disposed at one side of the second piezoelectric body of the second actuator array in the thickness direction;

a second conductive pattern disposed at the one side of the second piezoelectric body of the second actuator array in the thickness direction, the second conductive pattern of the second actuator array being insulated from the first conductive pattern of the second actuator array; and a third conductive pattern disposed at the one side of the first piezoelectric body of the second actuator array in the thickness direction, the third conductive pattern of the second actuator array being insulated from the first conductive pattern and the second conductive pattern of the second actuator array, wherein the first conductive pattern of the first actuator array electrically connects to the common electrode of the first actuator array, and does not electrically connect to the individual electrode of the first actuator array, the second conductive pattern of the first actuator array does not electrically connect to either the common electrode of the first actuator array or the individual electrode of the first actuator array, the third conductive pattern of the first actuator array does not electrically connect to the common electrode of the first actuator array, and electrically connects to the individual electrode of the first actuator array, the first conductive pattern of the second actuator array electrically connects to the common electrode of the second actuator array, and does not electrically connect to the individual electrode of the second actuator array, the second conductive pattern of the second actuator array does not electrically connect to either the common electrode of the second actuator array or the individual electrode of the second actuator array, the third conductive pattern of the second actuator array does not electrically connect to the common electrode of the second actuator array, and electrically connects to the individual electrode of the second actuator array, the second conductive pattern of the first actuator array and the second conductive pattern of the second actuator array are disposed between the first conductive pattern of the first actuator array and the first conductive pattern of the second actuator array in a perpendicular direction that is perpendicular to the thickness direction, the third conductive pattern of the first actuator array and the third conductive pattern of the second actuator array are disposed between the second conductive pattern of the first actuator array and the second conductive pattern of the second actuator array in the perpendicular direction, the second conductive pattern of the first actuator array is disposed between the first conductive pattern of the first actuator array and the third conductive pattern of the first actuator array in the perpendicular direction; and the second conductive pattern of the second actuator array is disposed between the first conductive pattern of the second actuator array and the third conductive pattern of the second actuator array in the perpendicular direction.

14. The piezoelectric actuator according to claim 13, further comprising:

a first connecting pattern that connects the first conductive pattern of the first actuator array and the first conductive pattern of the second actuator array to each other; and a second connecting pattern that connects the second conductive pattern of the first actuator array and the second conductive pattern of the second actuator array to each other, wherein the third conductive pattern of the first actuator array is included in a third conductive pattern array including a plurality of third conductive patterns that are arranged in a crossing direction that is perpendicular to the thickness direction and crosses the perpendicular direction, the third conductive pattern of the second actuator array is included in a second conductive pattern array including a plurality of second conductive patterns of the second actuator array that are arranged in the crossing direction, and the first connecting pattern, the second connecting pattern, the plurality of third conductive patterns of the third conductive pattern array of the first actuator array, and the plurality of third conductive patterns of the third conductive pattern array of the second actuator array are arranged in the crossing direction.

15. The piezoelectric actuator according to claim 14, further comprising another first connecting pattern and another second connecting pattern.

16. The piezoelectric actuator according to claim 13, wherein the second piezoelectric body of each of the first actuator array and the second actuator array includes a first recess provided at a one-side end portion thereof in the perpendicular direction, and a second recess provided at another-side end portion thereof in the perpendicular direction, the first conductive pattern of the first actuator array electrically connects to the common electrode of the first actuator array via the first recess of the first actuator array, the third conductive pattern of the first actuator array connects to the individual electrode of the first actuator array via the second recess of the first actuator array, the second conductive pattern of the first actuator array overlaps, in the thickness direction, with a portion of the second piezoelectric body of the first actuator array between the first recess of the first actuator array and the second recess of the first actuator array in the perpendicular direction, the first conductive pattern of the second actuator array electrically connects to the common electrode of the second actuator array via the first recess of the second actuator array, the third conductive pattern of the second actuator array connects to the individual electrode of the second actuator array via the second recess of the second actuator array, and the second conductive pattern of the second actuator array overlaps, in the thickness direction, with a portion of the second piezoelectric body of the second actuator array between the first recess of the second actuator array and the second recess of the second actuator array in the perpendicular direction.

17. The liquid ejection apparatus according to claim 8, wherein the second piezoelectric body includes a first recess provided at a one-side end portion thereof in the perpendicular direction, and a second recess provided at another-side end portion thereof in the perpendicular direction, the first conductive pattern electrically connects to the common electrode via the first recess, the third conductive pattern electrically connects to the individual electrode via the second recess, and the second conductive pattern overlaps, in the thickness direction, with a portion of the second piezoelectric body between the first recess and the second recess in the perpendicular direction.

* * * * *